(12) United States Patent
Zhang et al.

(10) Patent No.: US 10,109,505 B2
(45) Date of Patent: *Oct. 23, 2018

(54) DUAL MEDIUM FILTER FOR ION AND PARTICLE FILTERING DURING SEMICONDUCTOR PROCESSING

(71) Applicants: International Business Machines Corporation, Armonk, NY (US); STMicroelectronics, Inc., Coppell, TX (US)

(72) Inventors: John H. Zhang, Fishkill, NY (US); Laertis Economikos, Wappingers Falls, NY (US); Adam Ticknor, Poughkeepsie, NY (US); Wei-Tsu Tseng, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/424,297

(22) Filed: Feb. 3, 2017

(65) Prior Publication Data

US 2017/0148647 A1    May 25, 2017

Related U.S. Application Data

(60) Provisional application No. 13/479,087, filed on May 23, 2012.

(51) Int. Cl.
*H01L 21/67* (2006.01)
*B01D 15/36* (2006.01)
*B01D 24/00* (2006.01)

(52) U.S. Cl.
CPC ...... *H01L 21/67017* (2013.01); *B01D 15/362* (2013.01); *B01D 15/363* (2013.01);
(Continued)

(58) Field of Classification Search
CPC .. B01D 24/002; B01D 24/004; B01D 24/005; B01D 24/008; B01D 2221/14;
(Continued)

(56) References Cited

U.S. PATENT DOCUMENTS

| 62,757 A | * | 3/1867 | Lampson | ............. | B01D 24/004 |
| | | | | | 210/284 |
| 545,122 A | * | 8/1895 | Davis | ................... | B01D 24/004 |
| | | | | | 210/284 |

(Continued)

FOREIGN PATENT DOCUMENTS

| CN | 101622201 A | 1/2010 |
| CN | 203379753 U | 1/2014 |

(Continued)

*Primary Examiner* — Joseph L. Perrin
*Assistant Examiner* — Kevin G Lee
(74) *Attorney, Agent, or Firm* — Cantor Colburn LLP; Steven Meyers (57) ABSTRACT

The present disclosure is directed to fluid filtering systems and methods for use during semiconductor processing. One or more embodiments are directed to fluid filtering systems and methods for filtering ions and particles from a fluid as the fluid is being provided to a semiconductor wafer processing tool, such as to a semiconductor wafer cleaning tool.

8 Claims, 6 Drawing Sheets

(52) U.S. Cl.
CPC ........ *H01L 21/6704* (2013.01); *B01D 24/002* (2013.01); *B01D 2201/287* (2013.01); *B01D 2221/14* (2013.01); *B01D 2253/206* (2013.01)

(58) Field of Classification Search
CPC ............ B01D 2201/287; B01D 15/363; B01D 15/362; H01L 21/67017
See application file for complete search history.

(56) References Cited

U.S. PATENT DOCUMENTS

| | | | |
|---|---|---|---|
| 1,730,581 A | | 10/1929 | McMachen et al. |
| 3,667,604 A | * | 6/1972 | Lagoutte ................ B01D 24/30 210/136 |
| 3,841,489 A | | 10/1974 | Combest |
| 4,190,542 A | | 2/1980 | Hodgson et al. |
| 4,196,081 A | | 4/1980 | Pavia |
| 4,702,833 A | | 10/1987 | Miyata |
| 5,041,219 A | | 8/1991 | Strand et al. |
| 5,271,837 A | | 12/1993 | Discepolo et al. |
| 5,378,370 A | | 1/1995 | Brane et al. |
| 5,614,088 A | * | 3/1997 | Nagai ................ B01D 19/0031 210/143 |
| 5,635,063 A | | 6/1997 | Fajan et al. |
| 5,635,079 A | * | 6/1997 | Becking, II ............. C02F 1/003 210/266 |
| 5,919,365 A | * | 7/1999 | Collette .................... A45F 3/20 210/419 |
| 6,531,267 B2 | | 3/2003 | Oberlander |
| 7,311,847 B2 | * | 12/2007 | Kashkoush ............. C02F 9/005 210/143 |
| 8,623,206 B2 | | 1/2014 | Wilder et al. |
| 2001/0013161 A1 | | 8/2001 | Kitano et al. |
| 2002/0124906 A1 | | 9/2002 | Suzuki et al. |
| 2005/0236268 A1 | | 10/2005 | Mishima et al. |
| 2005/0279694 A1 | | 12/2005 | Straeffer et al. |
| 2008/0245738 A1 | * | 10/2008 | Coulter .................. C02F 1/008 210/650 |
| 2010/0032381 A1 | | 2/2010 | O'Brien et al. |
| 2010/0044311 A1 | | 2/2010 | Kobayashi et al. |
| 2010/0126934 A1 | | 5/2010 | Nakazato et al. |
| 2012/0043280 A1 | | 2/2012 | Wang et al. |
| 2012/0090470 A1 | | 4/2012 | McKenna et al. |

FOREIGN PATENT DOCUMENTS

| | | |
|---|---|---|
| JP | 2007044565 A | 2/2007 |
| WO | 2004033097 A1 | 4/2004 |
| WO | 2008103536 A1 | 8/2008 |

* cited by examiner

FIG. 6

DUAL MEDIUM FILTER FOR ION AND PARTICLE FILTERING DURING SEMICONDUCTOR PROCESSING

DOMESTIC PRIORITY

This application is a Divisional of Non-Provisional application Ser. No. 13/479,087, entitled "DUAL MEDIUM FILTER FOR ION AND PARTICLE FILTERING DURING SEMICONDUCTOR PROCESSING," filed May 23, 2012 which is incorporated herein by reference in its entirety.

BACKGROUND

The present disclosure is directed to systems and methods for filtering fluids for use during semiconductor processing.

Reducing or eliminating particle contamination in a semiconductor fabrication process is important for maximizing yield and device reliability. In that regard, semiconductor wafers are generally processed in ways that minimize exposure to particles. For instance, wafers are typically fabricated in cleanrooms that minimize the quantity of particles in the surrounding environment. Similarly, fluids used to process the semiconductor wafers are typically filtered to remove particles from the fluid before the fluid is provided to the processing tools.

Typically, the fluid is filtered as it is being provided to the processing tool. Therefore, the flow through capacity of a filter is an important factor when selecting a filter. In general, semiconductor processing tools use large quantities of fluid and thus require filters that are capable of filtering at suitable rates.

Furthermore, in order for a wafer fabrication facility to maintain high throughput, filters used with the processing tools preferably are low cost and do not require frequent maintenance, which typically results in processing delays.

In view of the above needs, standard fluid filters that are used to filter water, such as reverse osmosis filters, are generally not used as these filters are typically expensive, have low flow through capacity, and require frequent maintenance.

SUMMARY

The present disclosure is directed to fluid filtering systems and methods for use during semiconductor processing. One or more embodiments are directed to fluid filtering systems and methods for filtering ions and particles from a fluid as the fluid is being provided to a semiconductor wafer processing tool, such as to a semiconductor wafer cleaning tool.

DETAILED DESCRIPTION

Figure 1:
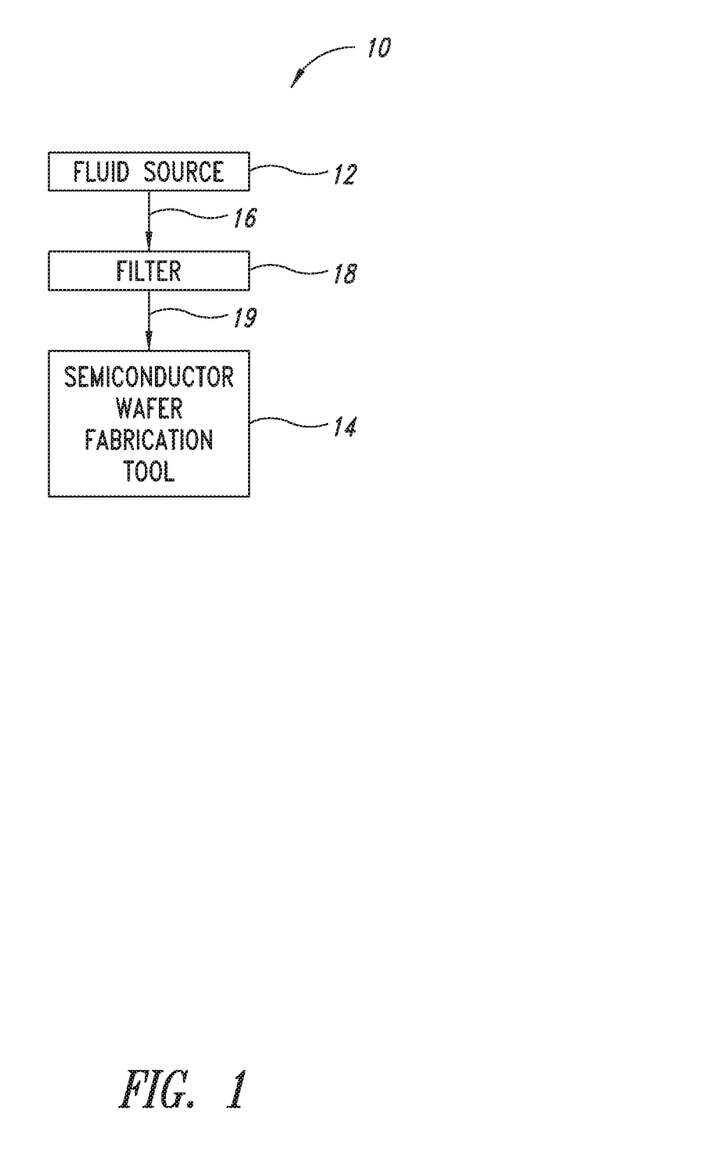
FIG. 1 is a block diagram of a system according to an embodiment of the present disclosure.

FIG. 1 is a block diagram of a system 10 according to an embodiment of the present disclosure. The system 10 includes a fluid source 12 in fluid communication with a semiconductor wafer fabrication tool 14 via a fluid path 16. That is, an outlet of the fluid source 12 provides fluid along the fluid path 16 to an inlet of the fabrication tool 14. In the fluid path 16 at a location downstream from the fluid source 12 and upstream of the fabrication tool 14, there is a filter 18 that is configured to receive fluid from the fluid source 12 via an inlet.

The filter 18 removes particles and ions, such as metal ions, from the received fluid and provides the filtered fluid to the fluid path 19 via an outlet. Example ions that may be removed from the fluid include Cu, Fe, Na, Co, Ti, and Ta. The filtered fluid is provided to an outlet of the filter 18 and provided to an inlet of the fabrication tool 14 via the fluid path 16.

The fabrication tool 14 may be any device that uses a fluid to process semiconductor wafers. Example fabrication tools include a water wash, wet cleaning, chemical vapor deposition, reactive-ion etching, lithography, or any other fabrication tool.

The fluid may be a liquid, a gas, or a combination thereof. In some embodiments, the fluid is water or a chemical solution, such as surfactant. In other embodiments, the fluid is a gas such as $N_2$, argon, silane, or the like.

The fluid paths 16 and 19 may be any conduit configured to allow fluid to flow therein. It is to be appreciated that in some embodiments, a portion of the fluid path 19, such as the portion downstream from the filter 18, or the entire fluid path 16 and 19 may be a part of the fabrication tool 14. Similarly, the fluid path 19 may be in fluid communication with more than one fabrication tool.

As discussed above, filters for removing particles from fluids used with semiconductor processing tools has been previously used. While developing processing steps for miniaturizing semiconductor devices, however, the inventors unexpectedly identified that by further filtering metal ions from the fluid, wafer processing yield and reliability significantly improved. Further, that in situ filtering was particularly beneficial. In particular, a test conducted on miniaturized devices appears to indicate that metal ions introduced during the manufacture and cleaning of wafers resulted in the failure of reliability test on time-dependent dielectric breakdown.

Figure 2:
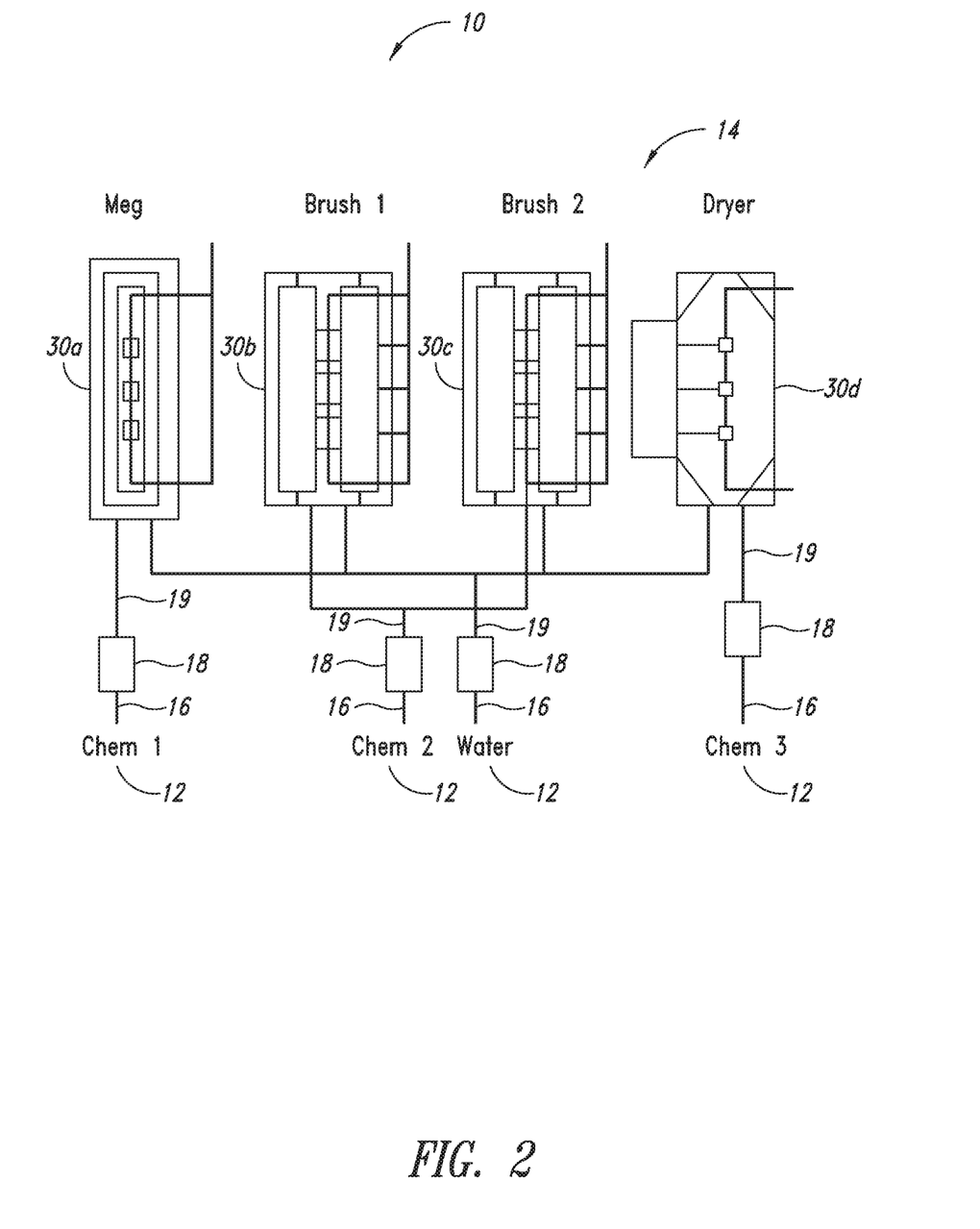
FIG. 2 is a partial schematic of another system according to an embodiment of the present disclosure.

FIG. 2 illustrates one example of a system 20 shown in FIG. 1. The fabrication tool of FIG. 2 is a cleaning tool configured to clean wafers after a processing step, such as after chemical-mechanical polishing. The cleaning tool 14 includes four stages, a megasonic tank 30a, a first double-sided brush 30b, a second double-sided brush 30c, and a spin rinse dryer 30d. Each stage 30a-d of the cleaning tool 14 is in fluid communication with two fluid sources 12 via fluid paths 19. In particular, the megasonic tank 30a, the first and second double-sided brushes 30b, 30c and the spin rinse dryer 30d are each in fluid communication with a water source 12 and are configured to receive water from the water source 12. In some embodiments, the water source 12 is a deionized water source. In that regard, the water has been first filtered by a course filter to remove large particles and chemicals, such as chlorine. The megasonic tank 30a is in fluid communication with Chemical 1 source 12 and is configured to receive Chemical 1. The first and second double-sided brushes 30b, 30c are in fluid communication with Chemical 2 source 12 and are configured to receive Chemical 2. The spin rinse dryer 30d is in fluid communication with Chemical 3 source 12 and is configured to receive Chemical 3.

Located between the fluid sources 12 and the various stages 30a-d of the fabrication tool 12 there are filters 18 configured to filter metal ions and particles from the fluid as the fluid is being provided to the various stages 30a-d of the cleaning tool 12. As will be explained below, the filters 18 may be a single filter configured to filter both the metal ions and the particles or may be two separate filters.

The filter 18 works in situ in the system as fluid is provided to the tools. Namely, the fluid flows through the filter 18 at approximately the same rate it is delivered to the respective semiconductor tool 30a-30d. This provides a few benefits. First, no storage of the filtered fluid is required. Second, the filtered fluid does not have a chance to be contaminated again as might occur if it sits for a period of time in a holding tank or long set of delivery tubes. The fluid lines 19 can be made extremely short, for example, embedded into the semiconductor tool itself, just prior to use, to reduce the chance that additional ions may enter or be created in the fluid after cleaning by fitter 18.

Referring to the megasonic tank 30a, when the cleaning tool 14 is in use, water and Chemical 1 flow from the water source 12 and the Chemical 1 source 12, respectively, to inlets of the filters 18 via the fluid path 16. The filters 18 remove particles and metal ions from the water and chemical 1 and provide the filtered fluid to the fluid path 19 via an outlet of the filter 18. The megasonic tank 30a receives the filtered water and chemical 1 for processing a wafer therein. It is to be understood that the other stages 30b-d of the cleaning tool 14 function in the same manner.

Figure 3:
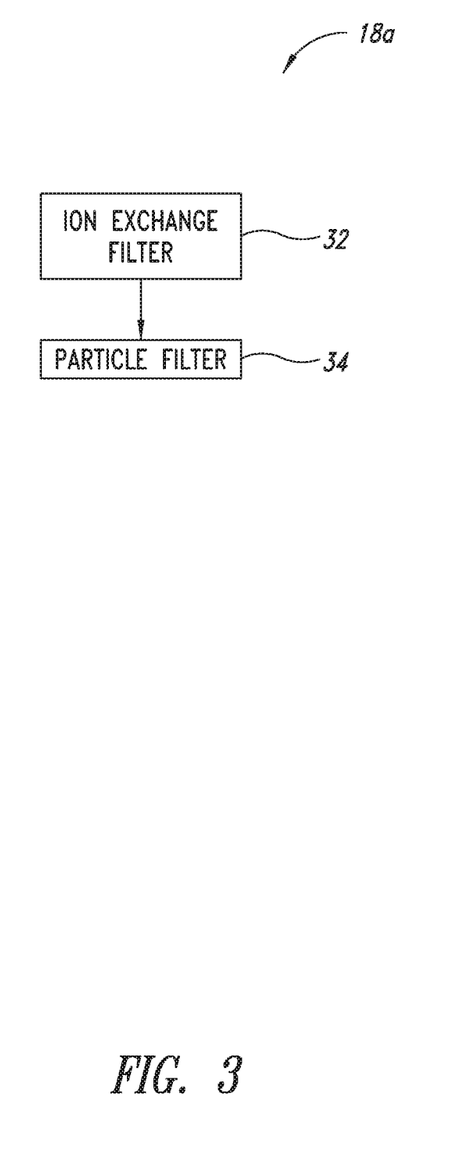
FIG. 3 is a block diagram of an example filter according to an embodiment of the present disclosure.

FIG. 3 illustrates one embodiment of a filter 18a for use in the systems of FIGS. 1 and 2. In this embodiment, the filter 18a includes two filters in fluid communication with each other in series. In the illustrated embodiment, the filter 18a includes an ion exchange filter 32 having an outlet in fluid communication with an inlet of a particle filter 34. The ion exchange filter 32 and the particle filter 34 may be located in the fluid path 16 between the fluid source 12 and the fabrication tool 14 in the systems 10 and 30 of FIGS. 1 and 2, respectively. For instance, an inlet of the ion exchange filter 32 may be in fluid communication with the outlet of the fluid source 12 and an outlet of the particle filter 34 may be in fluid communication with an inlet of the fabrication tool 14.

The ion exchange filter 32 includes a conventional ion exchange medium, such as an ion exchange resin, and is configured to remove anions, cations, or a combination thereof from fluid. In some embodiments, cations are replaced with hydrogen ions using cation-exchange resins and anions are replaced with hydroxyls using anion-exchange resin, thus filtering out the ions from the fluid. In other embodiments, however, other exchanges may be made.

The particle filter 34 includes a conventional particle filter medium, such as a particle membrane, and is configured to remove particles from the fluid. The particle size to be removed can be extremely small if desired, for example, 1 micron or less, depending on the fluid and the needs of the semiconductor tool.

With reference to the filter 18a of FIG. 3 in use in the system 10 of FIG. 1, fluid flows from the fluid source 12 to the ion exchange filter 32, which removes ions from the fluid. The filtered fluid is then provided from an outlet of the ion exchange filter 32 to the particle filter 34, which removes particles from the fluid. The filtered fluid is provided from the outlet of the particle filter 34 to the fabrication tool 14.

Although FIG. 3 illustrates the ion exchange filter 32 located upstream from the particle filter 34, it is to be appreciated that their orientation may be reversed. That is, in some embodiments, the particle filter may be located upstream from and in fluid communication with the ion exchange filter. In that regard, the particles are removed from the fluid before ions are removed in the fluid.

Figure 4:
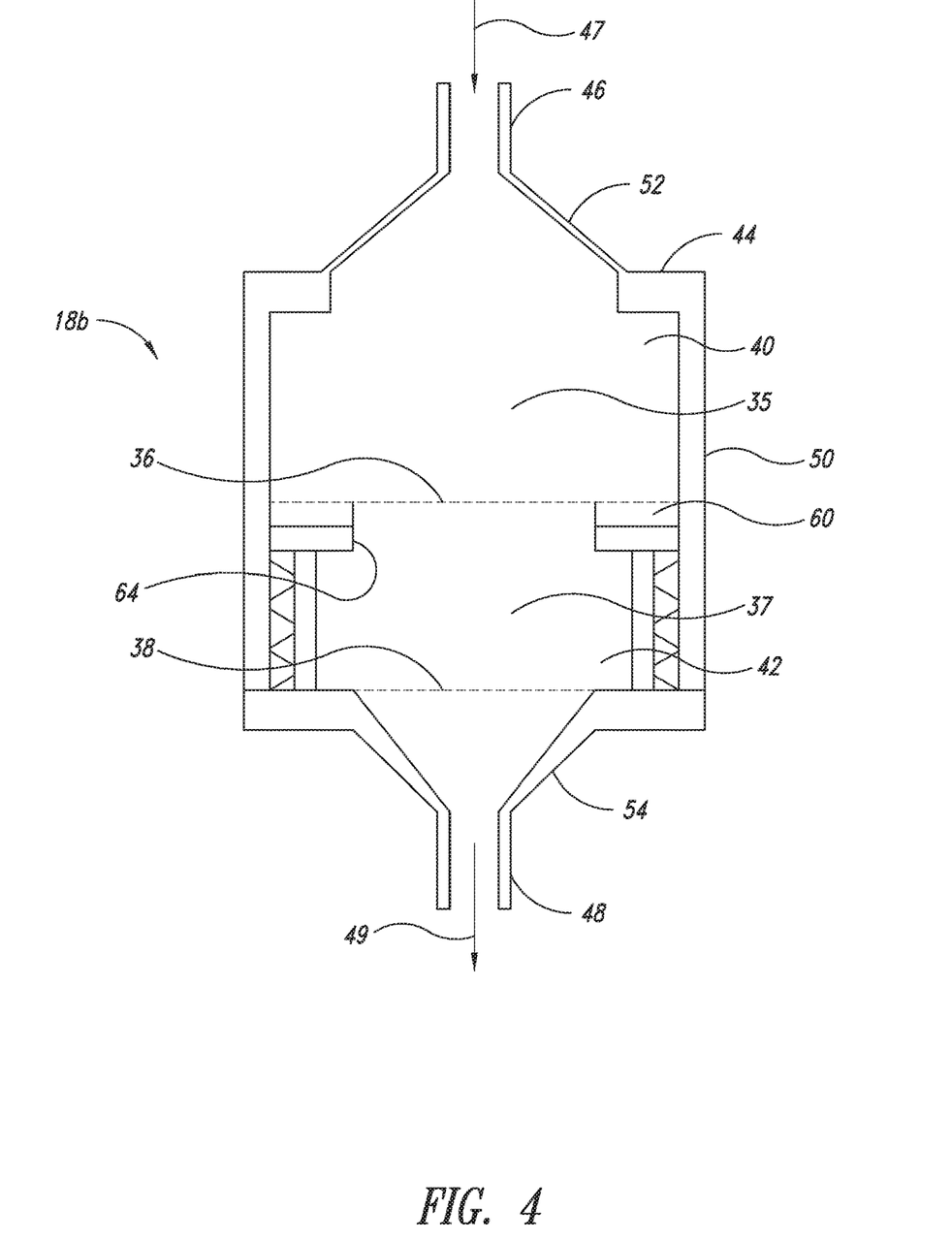
FIG. 4 is a cross-section schematic of another example filter according to an embodiment of the present disclosure.

FIG. 4 illustrates another embodiment of a filter 18b for use in the systems 10 and 20 of FIG. 1 or 2, respectively. In this embodiment, the filter 18b is a dual medium filter that includes an ion exchange medium 36 and a particle medium 38. In that regard, the filter 18b is configured to filter both ions and particles from the fluid received from a fluid source 12. In the illustrated embodiment, the filter 18b includes first and second chambers 40, 42, the first of which includes the ion exchange medium 35 held in place by a resin support net 36 that is configured to filter metal ions from fluid that passes through the first chamber 40 and the second of which includes a conventional particle filter medium 37 held in place by a membrane support net 38 that is configured to filter particles from fluid that passes through the second chamber 42.

Figure 5:
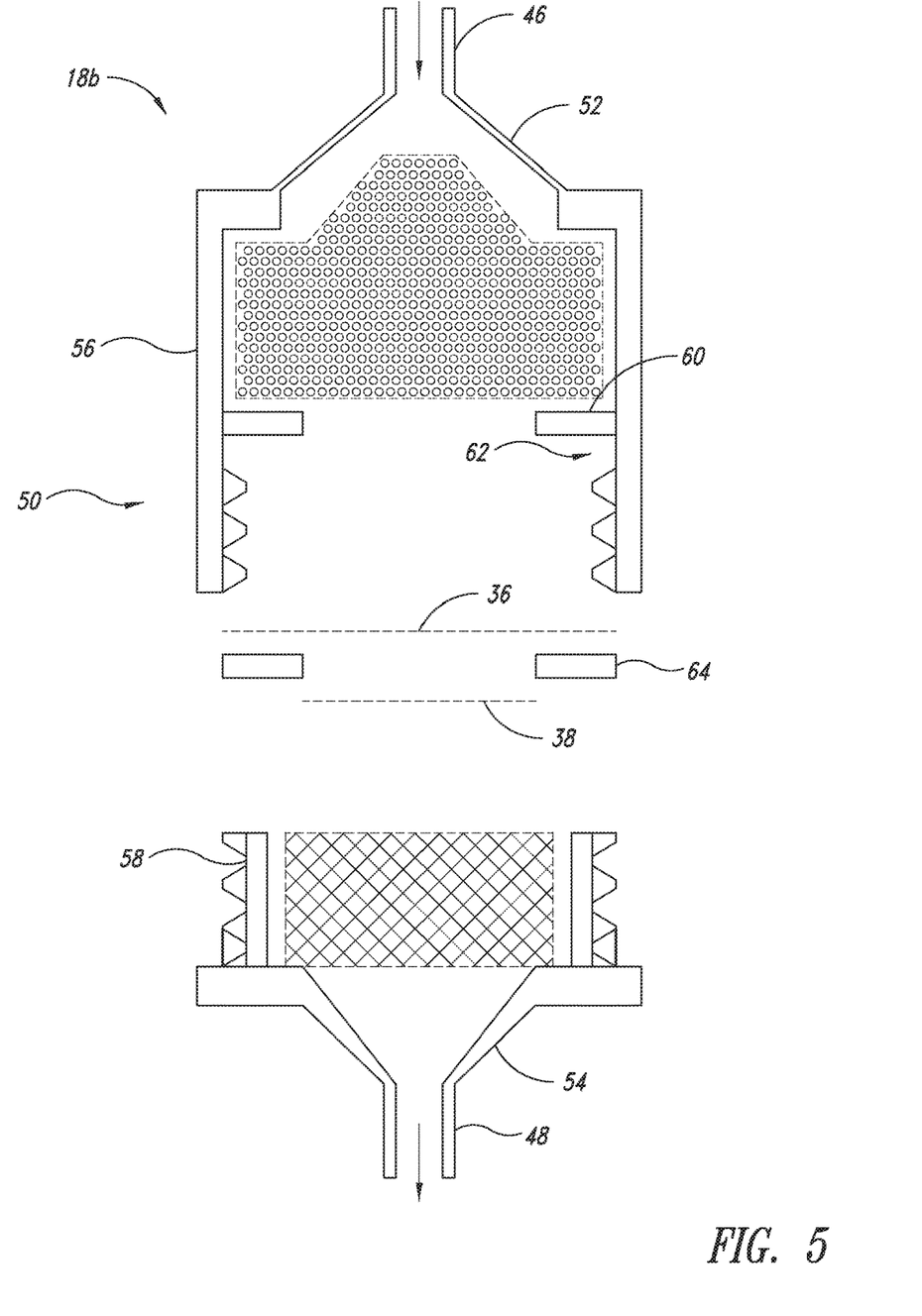
FIG. 5 is an exploded view of the filter shown in FIG. 4.

Referring to both FIGS. 4 and 5, the filter 18b has a housing 44 that includes an inlet 46 for receiving fluid and an outlet 48 for allowing the filtered fluid to flow out of the filter 18b. The housing 44 includes a main body 50 of cylindrical shape that transitions to the inlet 46 at an inlet portion 52 with an inverse funnel shape and that transitions to the outlet 48 at an outlet portion 54 with a funnel shape. In that regard, the main body 50 has a larger inner diameter than the inlet 46 and the outlet 48.

Fluid flows into the filter 18b as shown by the arrow 47, to enter the filter at the inlet 46. It flows in series through both filter media 35 and 37 and exists at the outlet 48, as shown by arrow 49. The fluid is clean, ready for immediate use. The size and structure of the filter media 35 and 37 are selected to provide fluid at the flow rate needed for the tool. If a high flow rate is demanded, the housing 44 of the filter 18 is made larger in diameter to have a higher throughput rate; if low flow rates are acceptable, the filter area and thus the diameter of the housing 44 of the filter 18 can be smaller.

As best shown in FIG. 5, the main body 50 of the housing 44 includes a top portion 56 and a bottom portion 58 that are removably secured to one another. In the illustrated embodiment, the top portion 56 includes inner threads that mate with outer threads of the bottom portion 58. In that regard, the bottom portion 58 has a smaller diameter than the top portion 56, such that the bottom portion 58 fits into and secures with the top portion 56 via the mating threads. The top portion 56 includes a circular member 60 located a distance above the inner threads to create a gap 62 therebetween. When the bottom portion 58 is located inside the top portion 56, a seal ring 64 is located in the gap 62 sealing the first chamber 40 from the second chamber 42.

As indicated above, the first chamber 40 includes a conventional ion filter medium 35, such as an ion exchange resin, which is configured to filter metal ions. The filter medium 35 and 37 are not shown in FIG. 4 for ease in seeing the entire chamber and internal filter structure, but are shown schematically in FIGS. 5 and 6. The ion exchange resin may be further supported by a net 36. The ion filter medium 35 is located proximate the circular member 60 of the top portion 56 of the housing 44. In some embodiments, the ion filter medium 35 fills to the perimeter of the first chamber 40. The ion filter net 36 may rest against the surface of the circular member 60 or may be secured to the circular member 60 or to the top portion 56 of the housing 44. The ion filter medium 35 may be configured to replace cations, anions or a combination thereof. Characteristics of resin, such as type, size, material, and shape, for the ion filter medium 35 may be selected based on the ions to be filtered from the fluid. As indicated above, the inlet 46 of the housing 44 has an inverted funnel shape. The additional cross sectional area in the main body 50 in the first chamber 40 created by the inverted funnel shape increases the area in which the ion filter medium 36 may filter fluid and increases the filter flow rate.

As indicated above, the second chamber 42 includes a particle filter medium 37, such as a particle membrane that is configured to filter particles. The particle membrane may be supported by a net 38. The particle filter medium 37 is located proximate the outlet portion 54 of the housing 44 and is configured to filter particles from the fluid. The larger inner diameter of the main body 50 allows for the particle filter medium 38 to filter a larger area than if the particle filter medium 38 were located at the outlet 48. Characteristics of membrane, such as type, size, material, and shape, for the particle filter medium 38 may be selected based on the size of the particles to be filtered from the fluid.

It is to be appreciated that in other embodiments the first and second chambers 40, 42 may be reversed. That is, the first chamber 40 may include the particle filter medium 37 and the second chamber 42 may include the ion filter medium 35. In a further embodiment, the ion filter medium 37 may be positioned between two particles filter media in a three chamber filter. The first filter is a particle filter, followed by the ion filter, followed by a fine particulate filter, having all three in one housing in series.

In one embodiment, the housing 44 is transparent to allow visual inspection of the particle and ion filter mediums 36, 38. Typically, the particle and ion filter mediums visibly change, such as by changing color, indicating that the mediums should be replaced and/or cleaned.

Figure 6:
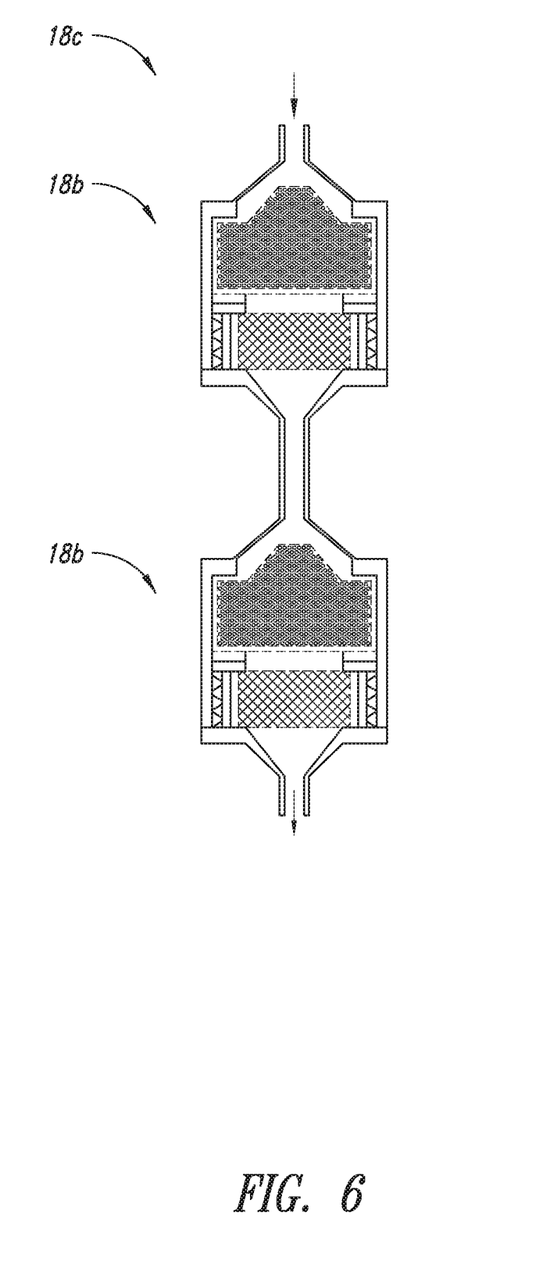
FIG. 6 is a cross-section schematic of another example filter according to an embodiment of the present disclosure.

FIG. 6 illustrates another embodiment of a filter 18c for use in the systems 10 and 20 of FIGS. 1 and 2, respectively. In particular, the filter 12c of FIG. 6 includes first and second dual medium filters 18b of FIG. 4 in fluid communication with each other in series. In this embodiment, however, the first dual medium filter 18b includes a first chamber 40 having an ion filter medium 36 configured to filter cations and the second dual medium filter 18b includes a first chamber 40 having an ion filter medium 36 configured to filter anions. In use, the first dual medium filter 18b is configured to receive fluid from the fluid source 12 via the fluid paths 16 shown in FIGS. 1 and 2 and remove cations and particles from the fluid as described above in reference to FIGS. 4 and 5. The first dual medium 18b filter then provides the fluid to the second dual medium filter 18b. The second dual medium filter removes anions and particles from the fluid as described above in reference to FIGS. 4 and 5 and provides the filtered fluid to the fluid path or to the fabrication tool. It is to be appreciated that the order of the first dual medium filter and the second dual medium filter may be reversed such that the anions are filtered from the fluid before the cations are filtered from the fluid.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method of processing a semiconductor wafer, the method comprising:
   receiving a fluid from fluid source for delivery to a semiconductor wafer tool;
   flowing the fluid through a housing, including:
   filtering the fluid to remove ions from the fluid in situ as the fluid flows to the semiconductor wafer tool, filtering the fluid to remove ions from the fluid including flowing the fluid through an ion exchange medium including a cylindrical main portion and a funnel shaped inlet portion, extending from an upper periphery of the cylindrical main portion, that are both spaced apart from an inner surface of the housing such that the fluid flows into the ion exchange medium through the surfaces of the cylindrical main portion and the funnel shaped inlet portion, the funnel shaped inlet portion having a surface area that is greater than a cross sectional area of the main portion of the ion exchange medium; and
   filtering the fluid to remove particles from the fluid in situ as the fluid flows to t semiconductor wafer tool; and
   providing the ion and particle filtered fluid to the semiconductor wafer tool for processing the semiconductor wafer at the same rate the fluid is being filtered.

2. The method of claim 1, wherein the ions are removed from the fluid before the particles are removed from the fluid.

3. The method of claim 1, wherein filtering the fluid to remove ions from the fluid comprises removing anions from the fluid.

4. The method of claim 3, further comprising filtering the fluid to remove cations from the ion and particle filtered fluid after removing the anions from the fluid, wherein the filtering the fluid to remove the anions includes flowing the filter through a first housing including a first ion exchange medium and a first particle filter and the filtering the fluid to remove the cations includes flowing the ion and particle filtered fluid through a second housing including a second ion exchange medium and a second particle filter.

5. The method of claim 1, wherein providing the ion and particle filtered fluid to the semiconductor wafer tool comprises providing the ion and particle filtered fluid to a semiconductor wafer cleaning tool configured to clean the semiconductor wafer.

6. The method of claim 1, wherein the housing includes an inlet having an inverted funnel shape.

7. The method of claim 6, wherein a surface of the funnel shaped inlet portion of the ion exchange medium is shaped to correspond with the inverted funnel shape of the inlet of the housing.

8. The method of claim 7, wherein the surface area of the funnel shaped inlet portion of the ion exchange medium that is greater than a cross sectional area of the main portion of the ion filter medium is exposed to the inlet of the housing.

* * * * *

UNITED STATES PATENT AND TRADEMARK OFFICE
CERTIFICATE OF CORRECTION

PATENT NO. : 10,109,505 B2  
APPLICATION NO. : 15/424297  
DATED : October 23, 2018  
INVENTOR(S) : John H. Zhang et al.

Page 1 of 1

It is certified that error appears in the above-identified patent and that said Letters Patent is hereby corrected as shown below:

On the Title Page

STMicroelectronics, Inc. Coppell, TX (US) should be listed as the second Assignee.

Signed and Sealed this  
Second Day of April, 2019

Andrei Iancu  
*Director of the United States Patent and Trademark Office*